(12) United States Patent
Shimizu et al.

(10) Patent No.: US 9,685,551 B2
(45) Date of Patent: Jun. 20, 2017

(54) SEMICONDUCTOR DEVICE AND INVERTER CIRCUIT

(71) Applicant: Kabushiki Kaisha Toshiba, Minato-ku (JP)

(72) Inventors: Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/055,795

(22) Filed: Feb. 29, 2016

(65) Prior Publication Data
US 2016/0284833 A1 Sep. 29, 2016

(30) Foreign Application Priority Data

Mar. 24, 2015 (JP) ................. 2015-061801
Dec. 3, 2015 (JP) ................. 2015-236875

(51) Int. Cl.
*H01L 29/161* (2006.01)
*H01L 29/78* (2006.01)
*H01L 29/16* (2006.01)
*H01L 29/167* (2006.01)
*H01L 29/10* (2006.01)
*H01L 29/04* (2006.01)
(Continued)

(52) U.S. Cl.
CPC ........ *H01L 29/7802* (2013.01); *H01L 21/049* (2013.01); *H01L 29/045* (2013.01); *H01L 29/1095* (2013.01); *H01L 29/167* (2013.01); *H01L 29/1608* (2013.01); *H01L 29/513* (2013.01); *H01L 29/517* (2013.01); *H01L 29/518* (2013.01)

(58) Field of Classification Search
CPC . H01L 51/56; H01L 51/5253; H01L 51/0072; H01L 51/5012; H01L 51/5072
USPC ............................................. 257/77
See application file for complete search history.

(56) References Cited

U.S. PATENT DOCUMENTS

2011/0254062 A1 10/2011 Shimizu et al.
2012/0199846 A1 8/2012 Shimizu et al.
(Continued)

FOREIGN PATENT DOCUMENTS

JP 2004-193288 7/2004
JP 2011-228429 11/2011
(Continued)

OTHER PUBLICATIONS

U.S. Appl. No. 14/813,651, filed Jul. 30, 2015, Teruyuki Ohashi et al.

*Primary Examiner* — Andy Huynh
(74) *Attorney, Agent, or Firm* — Oblon, McClelland, Maier & Neustadt, L.L.P.

(57) ABSTRACT

A semiconductor device according to embodiments includes a p-type SiC layer having a first plane, a gate electrode, and a gate insulating layer provided between the first plane of the SiC layer and the gate electrode. The gate insulating layer includes a first layer, a second layer, and a first region. The second layer has a higher oxygen density than the first layer. The first region is provided between the first layer and the second layer and includes a first element, the first element being at least one element in the group of N (nitrogen), P (phosphorus), As (arsenic), Sb (antimony), and Bi (bismuth).

20 Claims, 12 Drawing Sheets

(51) Int. Cl.
*H01L 29/51* (2006.01)
*H01L 21/04* (2006.01)

(56) References Cited

U.S. PATENT DOCUMENTS

2015/0084068 A1* 3/2015 Shimizu ............... H01L 21/045
257/77
2016/0087064 A1 3/2016 Ohashi et al.

FOREIGN PATENT DOCUMENTS

JP 2014-78727 5/2014
JP 2016-66641 A 4/2016

* cited by examiner

SEMICONDUCTOR DEVICE AND INVERTER CIRCUIT

CROSS-REFERENCE TO RELATED APPLICATION

This application is based upon and claims the benefit of priority from Japanese Patent Application No. 2015-061801, filed on Mar. 24, 2015, and Japanese Patent Application No. 2015-236875, filed on Dec. 3, 2015, the entire contents of which are incorporated herein by reference.

FIELD

Embodiments described herein relate generally to a semiconductor device and an inverter circuit.

BACKGROUND

SiC (silicon carbide) is expected as a material for a next-generation semiconductor device. SiC have excellent physical properties in comparison with Si (silicon). A band gap is three times, breakdown electric field strength is approximately ten times, and thermal conductivity is approximately three times. A low loss semiconductor device which can operate at a high temperature can be realized by using such properties.

However, for example, in the case where a metal insulator semiconductor field effect transistor (MISFET) is formed by using SiC, an interface state density between a semiconductor and a gate insulating layer increases in comparison with a case where Si is used. Therefore, there is a problem that mobility of electrical charges is decreased, and on-resistance of the MISFET is increased.

To solve the above problem, for example, there is a method in which an element of such as N (nitrogen) or P (phosphorus) to terminate an interface state is introduced at an interface between SiC and an insulating film. If this method is used, N (nitrogen) and P (phosphorus) function as an n-type dopant, and a threshold voltage of an n-channel type MISFET may fall down.

In order to prevent from causing malfunction of a SiC-MOSFET, the threshold voltage at least equal to or greater than 3 V is required at an operation temperature (for example, 200° C.), and preferably the threshold voltage is equal to or greater than 5 V. Because the threshold voltage may fall down to around 1 V, it is difficult to keep the required threshold voltage with termination using nitrogen or phosphorus.

DETAILED DESCRIPTION

Figure 1:
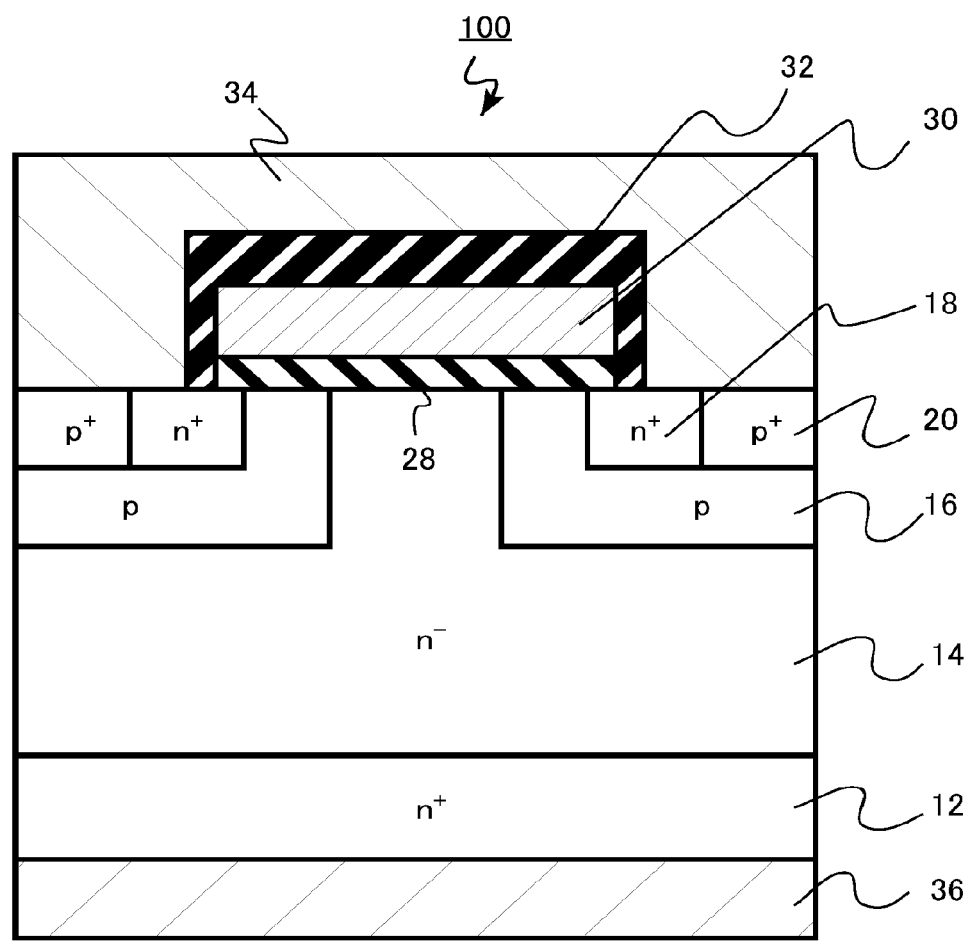
FIG. 1 is a schematic sectional view of a semiconductor device according to a first embodiment.

A semiconductor device according to embodiments described herein includes a p-type SiC layer having a first plane; a gate electrode; and a gate insulating layer provided between the first plane and the gate electrode, the gate insulating layer including; a first layer, a second layer having a higher oxygen density than the first layer, and a first region provided between the first layer and the second layer, the first region including a first element, the first element being at least one element in the group of N (nitrogen), P (phosphorus), As (arsenic), Sb (antimony), and Bi (bismuth).

Embodiments of the present disclosure will be described below with reference to drawings. In description below, same or similar members maybe denoted by same reference characters, and description of members already described will be appropriately omitted.

Further, in description below, symbols of $n^+$, $n$, $n^-$ and $p^+$, $p$, $p^-$ indicaterelative height of an impurity concentration in each conduction type. Specifically, $n^+$ indicates that an impurity concentration of an n type is relatively higher than n, and $n^-$ indicates that the impurity concentration of the n type is relatively lower than n. Furthermore, $p^+$ indicates that an impurity concentration of a p type is relatively higher than p, and $p^-$ indicates that the impurity concentration of the p type is relatively lower than p. An $n^+$ type and an $n^-$ type may be simply written as an n type, and a type and a p type may be simply written as a p type.

First Embodiment

A semiconductor device according to a first embodiment includes a p-type SiC layer having a first plane, a gate electrode, and a gate insulating layer. The gate insulating layer is provided between the first plane of the SiC layer and the gate electrode and includes a first layer, a second layer, and a first region. The second layer has a higher oxygen density than the first layer. The first region is provided between the first layer and the second layer. The first region includes a first element which is at least one element selected from the group consisting of N (nitrogen), P (phosphorus), As (arsenic), Sb (antimony), and Bi (bismuth) and has a first concentration peak of the first element.

FIG. 1 is a schematic sectional view illustrating a configuration of a MISFET which is a semiconductor device according to the present embodiment. A MISFET 100 is a double implantation MOSFET (DIMOSFET) in which a p-well and a source region are formed by ion implantation. Further, the MISFET100 is an n-channel type MOSFET in which an electron is a carrier.

The MISFET 100 includes an n$^+$-type SiC substrate 12. In the present description, with respect to faces of such as the SiC substrate 12, a face on an upper side in FIG. 1 is called a front face, and a face on a lower side is called a back face.

The SiC substrate 12 is, for example, a SiC substrate of 4H—SiC including N (nitrogen), in which an impurity concentration is $1\times10^{18}$ cm$^{-3}$ or more and $1\times10^{20}$ cm$^{-3}$ or less, as an n-type impurity.

Figure 2:
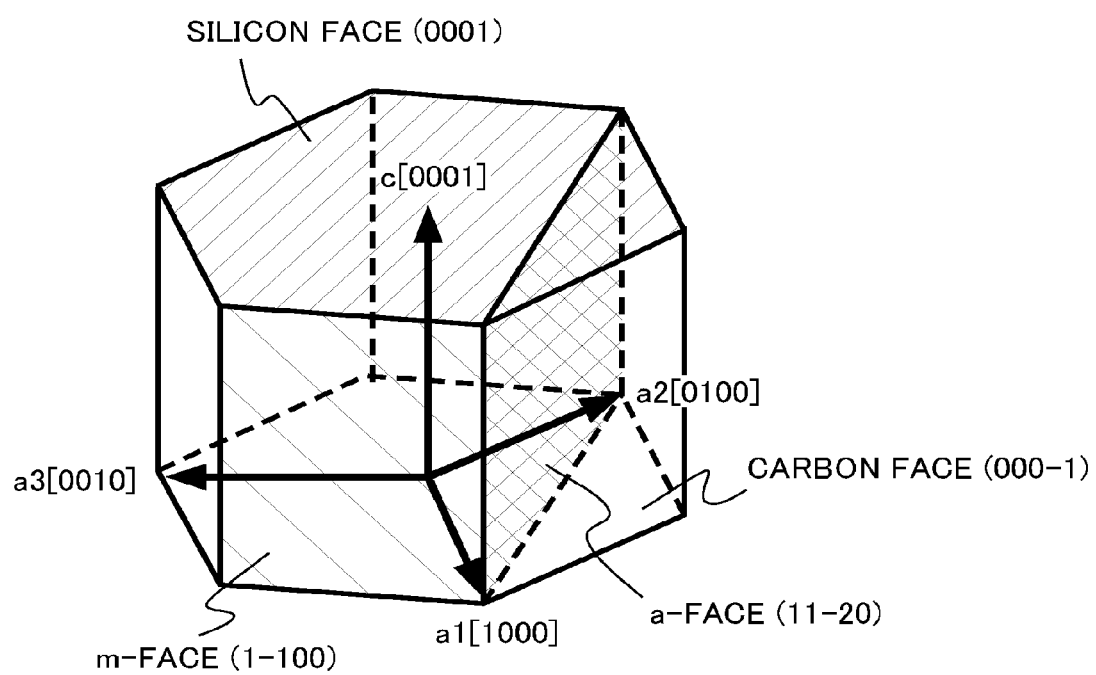
FIG. 2 illustrates a crystal structure of a SiC semiconductor according to the first embodiment.

FIG. 2 illustrates a crystal structure of a SiC semiconductor. A representative crystal structure of a SiC semiconductor is a hexagonal crystal system such as 4H—SiC. One side of faces (a top face of a hexagonal prism), in which a c-axis is a normal line, is a (0001) face. Faces equivalent to the (0001) face is called a silicon face and denoted as a {0001} face. Si (silicon) is arranged on the silicon face.

The other side of faces (a top face of the hexagonal prism) in which the c-axis is a normal line is a (000-1) face. Faces equivalent to the (000-1) face is called a carbon face and denoted as a {000-1} face. C (carbon) is arranged on the carbon face.

On the other hand, side faces (prism face) of the hexagonal prism are m-faces equivalent to a (1-100) face, in other words a {1-100} face. Further, faces passing through a pair of ridgelines which are not neighboring are a-faces equivalent to a (11-20) face, in other words a {11-20} face. Both of Si (silicon) and C (carbon) are arranged on the m-face and the a-face.

Hereinafter, an example will be described in which a front face of the SiC substrate 12 is a face inclined at 0° or more and 8° or less with respect to a silicon face, and a back face is a face inclined at 0° or more and 8° or less with respect to a carbon face.

On the front face of the SiC substrate 12, for example, an n$^-$ type drift layer 14 is formed in which an impurity concentration of an n-type impurity is $5\times10^{15}$ cm$^{-3}$ or more and $2\times10^{16}$ cm$^{-3}$ or less. The drift layer 14 is, for example, an epitaxial layer of SiC formed on the SiC substrate 12 by epitaxial growing.

A front face of the drift layer 14 is a face inclined at 0° or more and 8° or less with respect to a silicon face. A film thickness of the drift layer 14 is, for example, 5 μm or more and 100 μm or less.

On a part of the front face of the drift layer 14, for example, a p-type p-well region (SiC layer) 16 is formed in which an impurity concentration of a p-type impurity is $5\times10^{15}$ cm$^{-3}$ or more and $1\times10^{17}$ cm$^{-3}$ or less. The depth of the p-well region 16 is, for example, around 0.6 μm. The p-well region 16 functions as a channel region of the MISFET 100.

A front face (a first plane) of the p-well region (SiC layer) 16 is a face inclined at 0° or more and 8° or less with respect to a silicon face.

On a part of the front face of the p-well region 16, for example, an n$^+$-type source region 18 is formed in which an impurity concentration of an n-type impurity is $1\times10^{18}$ cm$^{-3}$ or more and $1\times10^{22}$ cm$^{-3}$ or less. The depth of the source region 18 is shallower than the depth of the p-well region 16 and, for example, around 0.3 μm.

Further, on a part of the front face of the p-well region 16 and on a side of the source region 18, for example, a p$^+$-type p-well contact region 20 is formed in which an impurity concentration of a p-type impurity is $1\times10^{18}$ cm$^{-3}$ or more and $1\times10^{22}$ cm$^{-3}$ or less. The depth of the p-well contact region 20 is shallower than the depth of the p-well region 16 and, for example, around 0.3 μm.

A gate insulating layer 28 is provided on front faces of the drift layer 14 and the p-well region (SiC layer) 16. The gate insulating layer 28 is formed so as to continuously extend over the drift layer 14 and the p-well region (SiC layer) 16.

A gate electrode 30 is formed on the gate insulating layer 28. For example, doped polysilicon can be used for the gate electrode 30. On the gate electrode 30, for example, an interlayer insulating film 32 formed of a silicon oxide film is formed.

The p-well region 16 sandwiched between the source region 18 and the drift layer 14 under the gate electrode 30 functions as a channel region of the MISFET 100.

The gate insulating layer 28 is provided between the gate electrode 30 and the p-well region (SiC layer) 16. The film thickness of the gate insulating layer 28 is, for example, 30 nm or more and 300 nm or less. Further, a conversion film thickness of a silicone oxide film of the gate insulating layer 28 is, for example, 30 nm or more and 60 nm or less.

Figure 3:
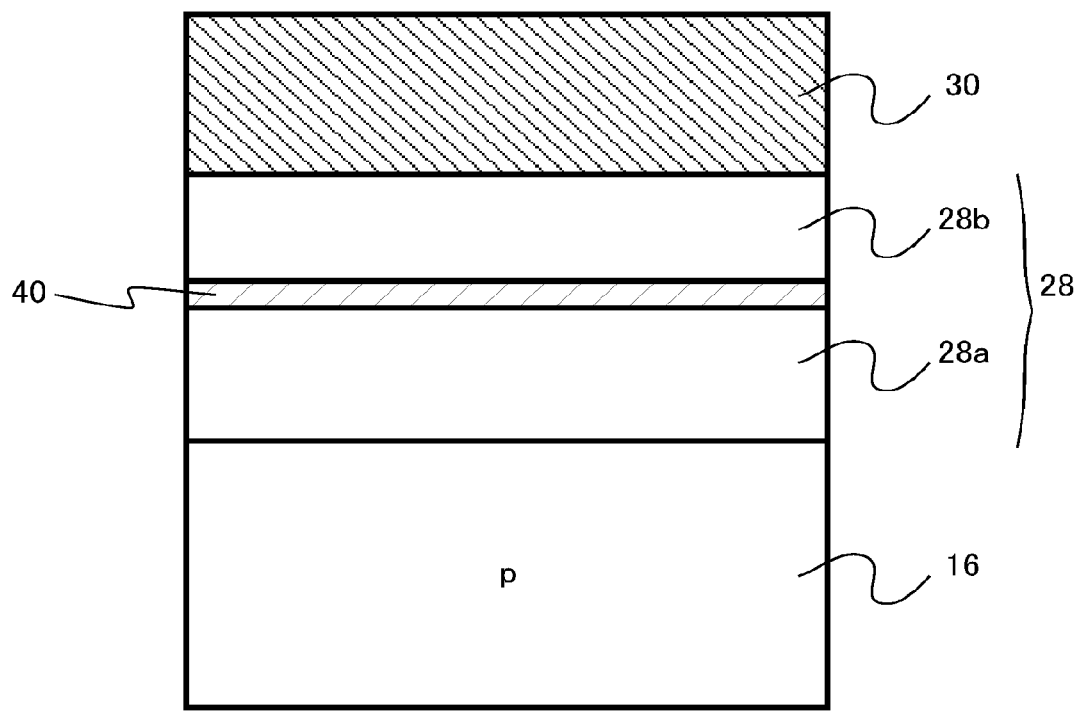
FIG. 3 is an enlarged view of a SiC layer, a gate insulating layer, and a gate electrode according to the first embodiment.

FIG. 3 is an enlarged view of a p-type SiC layer, a gate insulating layer, and a gate electrode according to the present embodiment.

The gate insulating layer 28 includes a first layer 28a, a second layer 28b, and a first region 40. The second layer 28b is provided between the first layer 28a and the gate electrode 30. The second layer 28b is provided on the first layer 28a. The second layer 28b contacts with the gate electrode 30.

The first layer 28a and the second layer 28b are, for example, an oxide or an oxynitride. The first layer 28a and the second layer 28b are, for example, one of materials selected from the group consisting of silicone oxide, aluminum oxide, hafnium oxide, zirconium oxide, hafnium aluminum oxide, zirconium aluminum oxide, hafnium silicate, and zirconium silicate.

An oxygen density of the second layer 28b is higher than an oxygen density of the first layer 28a. The first layer 28a is, for example, silicon oxide. The second layer 28b is, for example, a high dielectric constant film having a higher dielectric constant than silicon oxide. The second layer 28b is, for example, hafnium oxide.

The first region 40 is provided between the first layer 28a and the second layer 28b. The first region 40 is provided near the interface between the first layer 28a and the second layer 28b. The first region 40 includes at least one first element selected from the group consisting of N (nitrogen), P (phosphorus), As (arsenic), Sb (antimony), and Bi (bismuth).

The first region 40 has a first concentration peak of the first element. A full width at half maximum of the first concentration peak is preferably equal to or less than 1 nm. A full width at half maximum of the first concentration peak is preferably equal to or less than 0.5 nm.

The concentration measured at 1 nm or more away from the first concentration peak is preferably sufficiently small and equal to or less than $1\times10^{18}$ cm$^{-3}$. An element concentration can be confirmed by a secondary ion mass spectrometry (SIMS) and is preferably equal to or less than a detection limit of each element (approximately $1\times10^{27}$ cm$^{-3}$ or less).

The first element segregates on the interface between the first layer 28a and the second layer 28b. The first element combines with a metal element forming the second layer 28b having a high oxygen density.

The first element concentration of the first concentration peak is preferably $4\times10^{19}$ cm$^{-3}$ or more and $6.4\times10^{22}$ cm$^{-3}$ or less.

An oxygen density and a concentration/distribution of the first element can be calculated by, for example, a SIMS.

In the present embodiment, an oxygen density of the second layer 28b is higher than an oxygen density of the first layer 28a. However, an oxygen density of an upper layer film can be lower than an oxygen density of a lower layer film without any problem, and it is important that films having different oxygen densities are stacked. It will be described in the next embodiment.

The MISFET 100 includes a conductive source electrode 34 electrically connected to the source region 18 and the p-well contact region 20. The source electrode 34 functions as a p-well electrode which applies a potential to the p-well region 16.

The source electrode 34 is formed by stacking of, for example, barrier metal layers of Ni (nickel) and metal layers of Al (aluminum) on the barrier metal layers. The barrier metal layers of Ni and the metal layers of Al may form an alloy by reaction.

Further, a conductive drain electrode 36 is formed on a side opposed to the drift layer 14 on the SiC substrate 12, specifically a back face side. The drain electrode 36 is, for example, Ni (nickel).

In the present embodiment, an n-type impurity is preferably such as N (nitrogen) and P (phosphorus). However, As (arsenic) or Sb (antimony) is applicable. Further, a p-type impurity is preferably such as Al (aluminum). However, such as B (boron), Ga (gallium), or In (indium) is applicable.

Functions and effects of a semiconductor device according to the present embodiment will be described below.

A SiC-MISFET has a problem in which mobility of a carrier is decreased, and on-resistance is increased due to an interface state between a SiC layer and a gate insulating layer. Therefore, for example, there is a method in which N (nitrogen) or P (phosphorus) to terminate an interface state are introduced into the interface between the SiC layer and the insulating film. If this method is used, N (nitrogen) or P (phosphorus) function as an n-type dopant, and a threshold voltage of an n-channel type MISFET may be decreased. High mobility of an electron and a high threshold voltage is required in the n-channel type MISFET.

Figure 4:
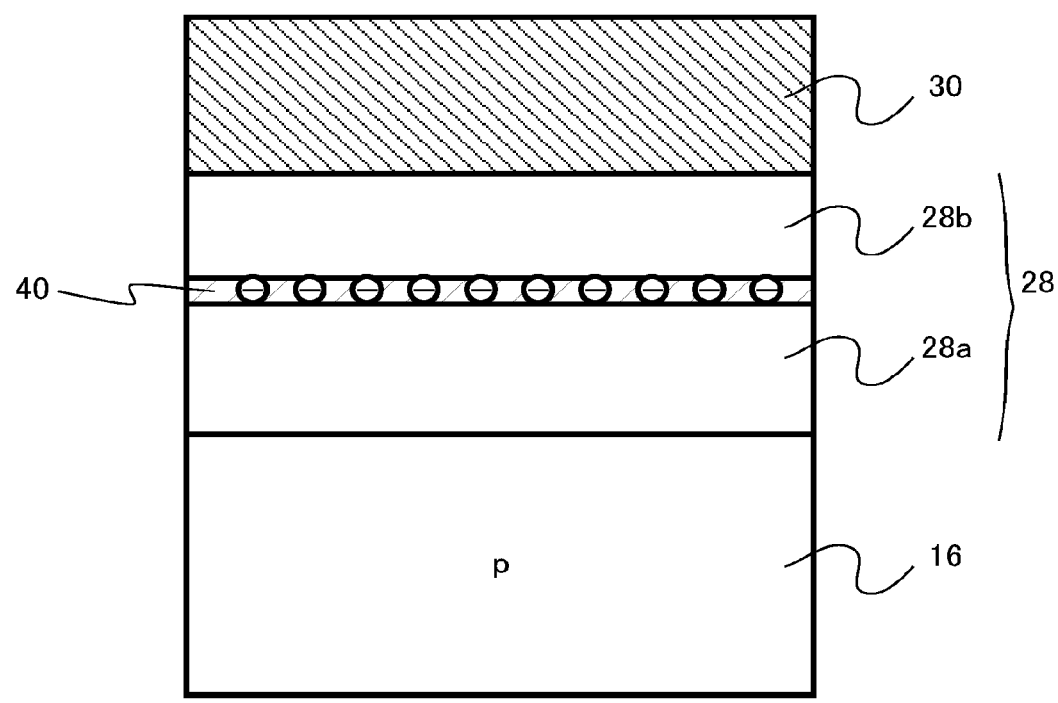
FIG. 4 is an explanatory diagram of functions and effects according to the first embodiment.

FIG. 4 is an explanatory diagram of functions and effects according to the present embodiment. In the present embodiment, a fixed negative charge exists in the first region 40. A threshold value of an n-channel type MISFET is increased by the fixed negative charge. Accordingly, a MISFET having a high threshold voltage can be realized.

In the present embodiment, the gate insulating layer 28 has a stacked structure of the first layers 28a and the second layers 28b which have different oxygen densities. As a result of a first principle calculation by an inventor of the present disclosure, it has been clarified that, when a first element selected from N (nitrogen), P (phosphorus), As (arsenic), Sb (antimony), and Bi (bismuth) traps an electron, the first element can be stabilized at an interface of films having different oxygen densities. The first element selected from N (nitrogen), P (phosphorus), As (arsenic), Sb (antimony), and Bi (bismuth) traps an electron and then the first element is fixed to an oxygen defect at the interface between the first layer 28a and the second layer 28b which have different oxygen densities. Therefore, a fixed negative charge is formed. And, the first element combines with a metal element forming a film having a high oxygen density.

The first element concentration of first concentration peak is preferably $4 \times 10^{19}$ cm$^{-3}$ or more and $6.4 \times 10^{22}$ cm$^{-3}$ or less. When the concentration is below the above range, an increase effect on a threshold voltage by the fixed negative charge may not be obtained. Further, it is difficult to introduce the first element over the above range into a film. The concentration of first concentration peak means a concentration at a top of the first concentration peak.

Further, the second layer 28b, in other words, a film having higher oxygen density, preferably contacts with the gate electrode 30. This is because, for example, in the case where the second layer 28b is a high dielectric metal oxide such as hafnium oxide and zirconium oxide, a fermi level pinning effect may be occurred between the second layer 28b and the gate electrode 30, and a threshold voltage of an MISFET is further increased.

Next, a method for manufacturing a semiconductor device according to the present embodiment will be described with reference to FIGS. 1 and 3. Especially, a method for manufacturing the gate insulating layer 28 will be described. An example will be described in which a first element is N (nitrogen).

First, a silicon oxide film is formed on the SiC layer 16 by thermal oxidation. This silicon oxide film becomes the first layer 28a. Next, a front face (surface) of the silicon oxide film is nitrided by nitrogen plasma processing.

Next, a hafnium oxide film is deposited by a CVD method. This hafnium oxide film becomes the second layer 28b. Then, annealing is performed in a nitrogen atmosphere. By annealing, N (nitrogen) on the front face of the silicon oxide film traps electrons and segregates on the interface between the front face of the silicon oxide film (first layer) 28a and the hafnium oxide film (second layer) 28b. Accordingly, a fixed negative charge is formed.

Then, for example, a polycrystal silicon gate electrode is formed.

Regarding other process steps, the MISFET 100 illustrated in FIGS. 1 and 3 is formed by using a known manufacturing method.

For example, in the case where a first element is P (phosphorus), As (arsenic), Sb (antimony), and Bi (bismuth), instead of processing for nitriding a front face of a silicon oxide film by nitrogen plasma, a process is performed in which P (phosphorus), As (arsenic), Sb (antimony), and Bi (bismuth) are adsorbed on the front face of the silicon oxide film by introducing phosphine (PH$_3$), arshin (AH$_3$), stibine (SbH$_3$), and bismuthine (BiH$_3$). In the case of N (nitrogen), a process introducing NH$_3$ on a front face of the silicon oxide film may be performed.

According to the present embodiment, an n-channel type MISFET having a high threshold voltage can be realized.

Second Embodiment

A semiconductor device according to a second embodiment is same as the semiconductor device according to the first embodiment other than upper and lower sides of a first layer and a second layer are inverted. Therefore, description of contents already described in the first embodiment may be omitted.

Figure 5:
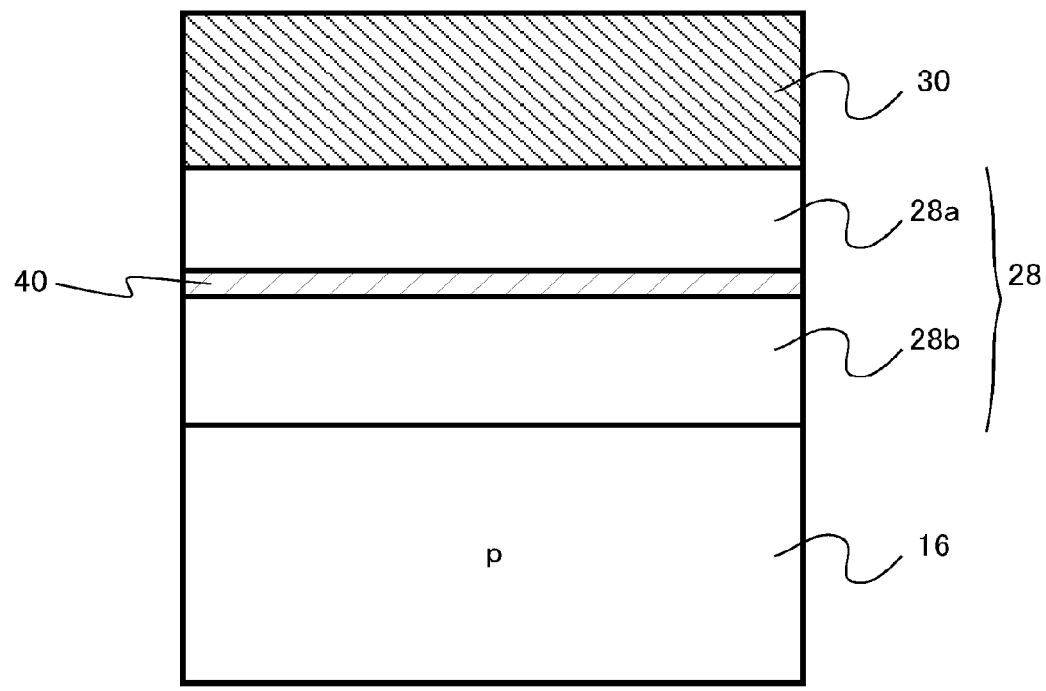
FIG. 5 is an enlarged view of a SiC layer, a gate insulating layer, and a gate electrode according to a second embodiment.

FIG. 5 is an enlarged view of a p-type SiC layer, a gate insulating layer, and a gate electrode according to the present embodiment. A first layer 28a is formed on a second layer 28b.

An oxygen density of the second layer 28b is higher than an oxygen density of the first layer 28a. For example, the first layer 28a is silicon oxide, and the second layer 28b is hafnium oxide.

A first region 40 is provided between the second layer 28b and the first layer 28a. The first region 40 is provided close to the interface between the second layer 28b and the first layer 28a. The first region 40 includes at least one first element selected from the group consisting of N (nitrogen), P (phosphorus), As (arsenic), Sb (antimony), and Bi (bismuth).

In the present embodiment, as with the first embodiment, a fixed negative charge exists in the first region 40. A threshold value of an n-channel type MISFET is increased by the negative charge. Accordingly, a MISFET having a high threshold voltage can be realized.

According to the present embodiment, an n-channel type MISFET having a high threshold voltage can be realized.

Third Embodiment

A semiconductor device according to a third embodiment is same as the semiconductor device according to the first embodiment other than that a second region is further included. The second region is provided between a SiC layer and a gate insulating layer. The second region includes at least one second element selected from the group consisting of N (nitrogen), P (phosphorus), As (arsenic), Sb (antimony), and Bi (bismuth) and has a second concentration peak of the second element. Description of contents already described in the first embodiment may be omitted.

Figure 6:
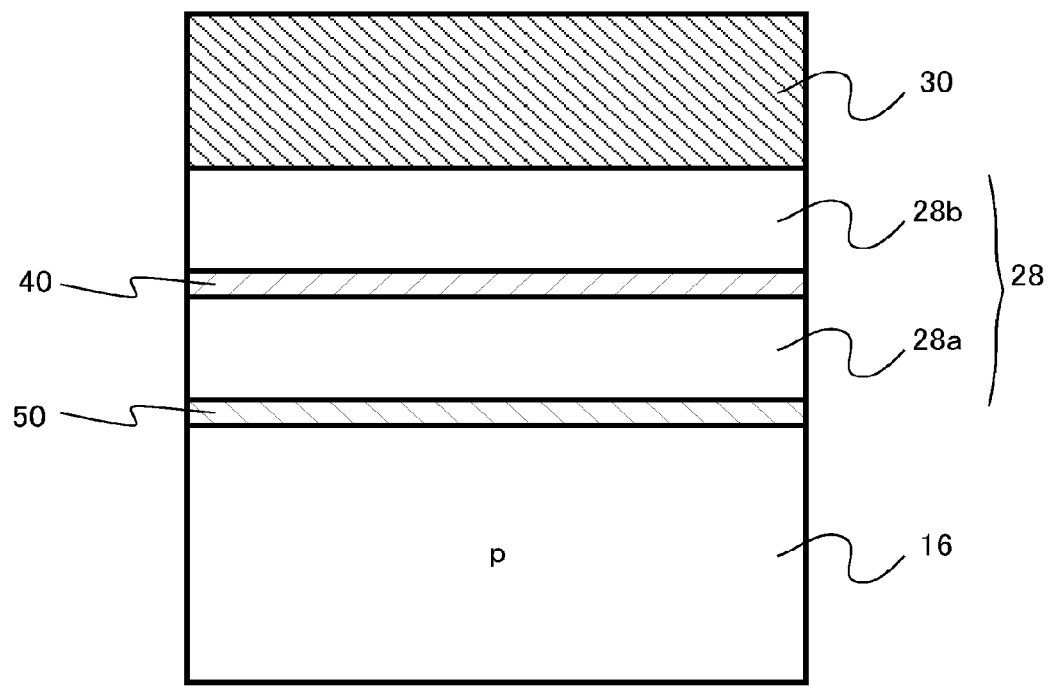
FIG. 6 is an enlarged view of a SiC layer, a gate insulating layer, and a gate electrode according to a third embodiment.

FIG. 6 is an enlarged view of a p-type SiC layer, a gate insulating layer, and a gate electrode according to the present embodiment. A second region 50 is further provided between a SiC layer 16 and a gate insulating layer 28.

The second region 50 includes at least one second element selected from the group consisting of N (nitrogen), P (phosphorus), As (arsenic), Sb (antimony), and Bi (bismuth).

The second region 50 has a second concentration peak of the second element.

A full width at half maximum of the second concentration peak is preferably equal to or less than 1 nm. A full width at half maximum of the second concentration peak is preferably equal to or less than 0.5 nm. The second element segregates on the interface between the SiC layer 16 and the gate insulating layer 28.

A concentration measured at 1 nm or more away from the concentration peak of the second element is preferably sufficiently small and equal to or less than $1 \times 10^{18}$ cm$^{-3}$. An element concentration can be confirmed by a SIMS and is preferably equal to or less than a detection limit of each element (approximately $1 \times 10^{17}$ cm$^{-3}$ or less).

Next, a method for manufacturing a semiconductor device according to the present embodiment will be described with reference to FIGS. 1 and 6. Especially, a method for manufacturing the gate insulating layer 28 will be described. An example will be described in which a first element and a second element are N (nitrogen).

First, a silicon oxide film is formed on the SiC layer 16 by thermal oxidation. This silicon oxide film becomes the first layer 28a.

Next, the silicon oxide film is, for example, thermally oxynitrided in nitric oxide (NO) atmosphere. By oxynitriding, the second region 50 is formed in which N (nitrogen) segregates on the interface between the SiC layer 16 and the silicon oxide film.

Next, a front face of the silicon oxide film is nitrided by performing nitrogen plasma processing.

Next, a hafnium oxide film is deposited by a CVD method. This hafnium oxide film becomes the second layer 28b. Then, annealing is performed in a nitrogen atmosphere. By annealing, N (nitrogen) on a front face of the silicon oxide film segregates on the interface between the silicon oxide film (first layer) 28a and the hafnium oxide film (second layer) 28b, and a fixed negative charge is formed.

Then, for example, a polycrystal silicon gate electrode is formed.

Regarding other process steps, a MISFET illustrated in FIGS. 1 and 6 is formed by using a known manufacturing method.

A second element terminates an interface state on the interface between the SiC layer 16 and the gate insulating layer 28. Therefore, electron mobility is improved by providing the second region 50. Accordingly, on-resistance of a MISFET is decreased.

Further, as with the first embodiment, a threshold voltage of the MISFET is increased by providing the first region 40.

According to the present embodiment, an n-channel type MISFET having both of a high mobility and a high threshold voltage can be realized.

In terms of process conformity, a first element and a second element are preferably the same element.

Further, in the case where a front face (first plane) of the SiC layer 16 is inclined at 0° or more and 8° or less with respect to a (0001) face, the second element is preferably P (phosphorus), As (arsenic), Sb (antimony), or Bi (bismuth). This is because, on a silicon face in which Si is arranged on an outermost face, a termination structure is stabilized by using P (phosphorus), As (arsenic), Sb (antimony), or Bi (bismuth). Especially, inexpensive P or As is preferable. For example, in the case where P is used, the manufacturing method is effective in which PH$_3$ is introduced on a substrate, and an oxide film is formed, then PH$_3$ is again introduced on the oxide film, and HfO$_2$ is formed.

In addition, in the case where a front face (first plane) of the SiC layer 16 is a face inclined at 0° or more and 8° or less with respect to a (000-1) face, or the first plane is a face inclined at 0° or more and 8° or less with respect to a <0001> direction, the second element is preferably N (nitrogen). This is because a termination structure is stabilized by using N (nitrogen) on a carbon face, an m-face, an a-face, in which C (carbon) is arranged on an outermost face. In this case, a thin thermal oxide film, HfO$_2$ is formed on the thermal oxide film, and nitrogen can be introduced into the first region 40 and the second region 50 by once performing NO nitriding. Nitrogen is stabilized at each position. Therefore, each region has the above-described peak.

The second element concentration of the second concentration peak is preferably $4 \times 10^{19}$ cm$^{-3}$ or more and $6.4 \times 10^{22}$ cm$^{-3}$ or less. When the concentration is below the above range, an improvement effect on mobility by interface terminal of the second element may not be obtained. Further, it is difficult to introduce the second element over the above range into the film. The concentration of the second concentration peak means a concentration at a top of the second concentration peak.

A concentration and distribution of the second element can be calculated, for example, by a SIMS.

Fourth Embodiment

In a semiconductor device according to a fourth embodiment, a gate insulating layer is same as the gate insulating layer according to the first embodiment other than that a multilayer stacked structure of first layers and second layers is included. Therefore, description of contents already described in the first embodiment will be omitted.

Figure 7:
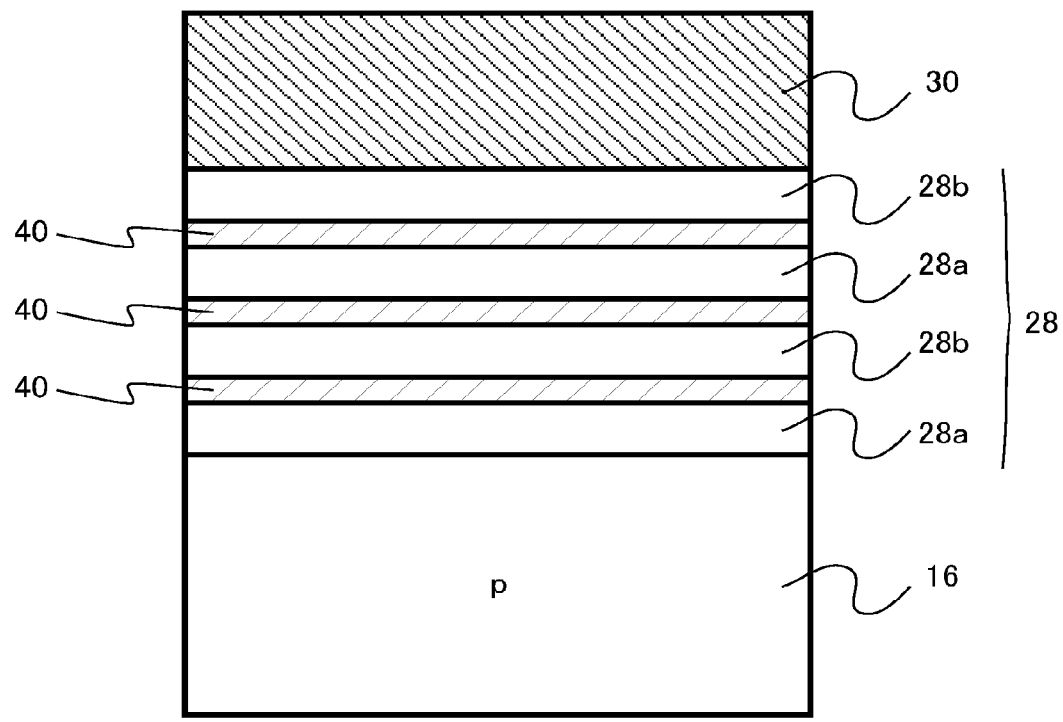
FIG. 7 is an enlarged view of a SiC layer, a gate insulating layer, and a gate electrode according to a fourth embodiment.

FIG. 7 is an enlarged view of a p-type SiC layer, a gate insulating layer, and a gate electrode according to the present embodiment. As illustrated in FIG. 7, a gate insulating layer 28 includes two layers of a stacked structure of first layers 28a and second layers 28b. Further, three layers of the first region 40 are included.

Figure 8:
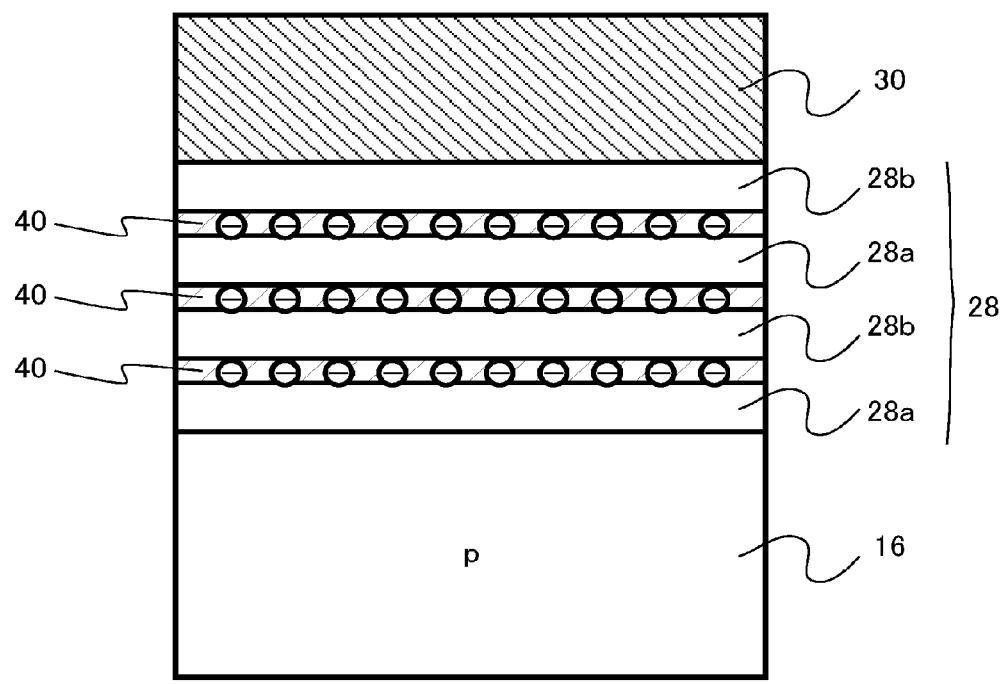
FIG. 8 is an explanatory diagram of functions and effects according to the fourth embodiment.

FIG. 8 is an explanatory diagram of functions and effects according to the present embodiment. In the present embodiment, two layers of the stacked structure of the first layers 28a and the second layers 28b are included, and three layers of a fixed negative charge are formed. An increase in a threshold voltage of a MISFET is proportional to the number of layers of the fixed negative charge. Therefore, according to the present embodiment, the threshold voltage of a MISFET is further increased in comparison with the first embodiment.

Herein, the example has been described in which two layers of the stacked structure of the first layers 28a and the second layers 28b are included. However, three or more layers of the stacked structure can be included. Especially, in case of a SiC-MISFET having a high breakdown voltage, a thick gate insulating layer can be applied. Therefore, a threshold voltage can be easily increased by increasing the number of layers.

Fifth Embodiment

A semiconductor device according to a fifth embodiment includes a gate insulating layer provided between a p-type SiC layer and a gate electrode. The gate insulating layer includes C (carbon) and at least one element selected from the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu). The semiconductor device according to the present embodiment is same as the semiconductor device according to the first embodiment other than a configuration of the gate insulating layer. Therefore, description of contents already described in the first embodiment will be omitted.

Figure 9:
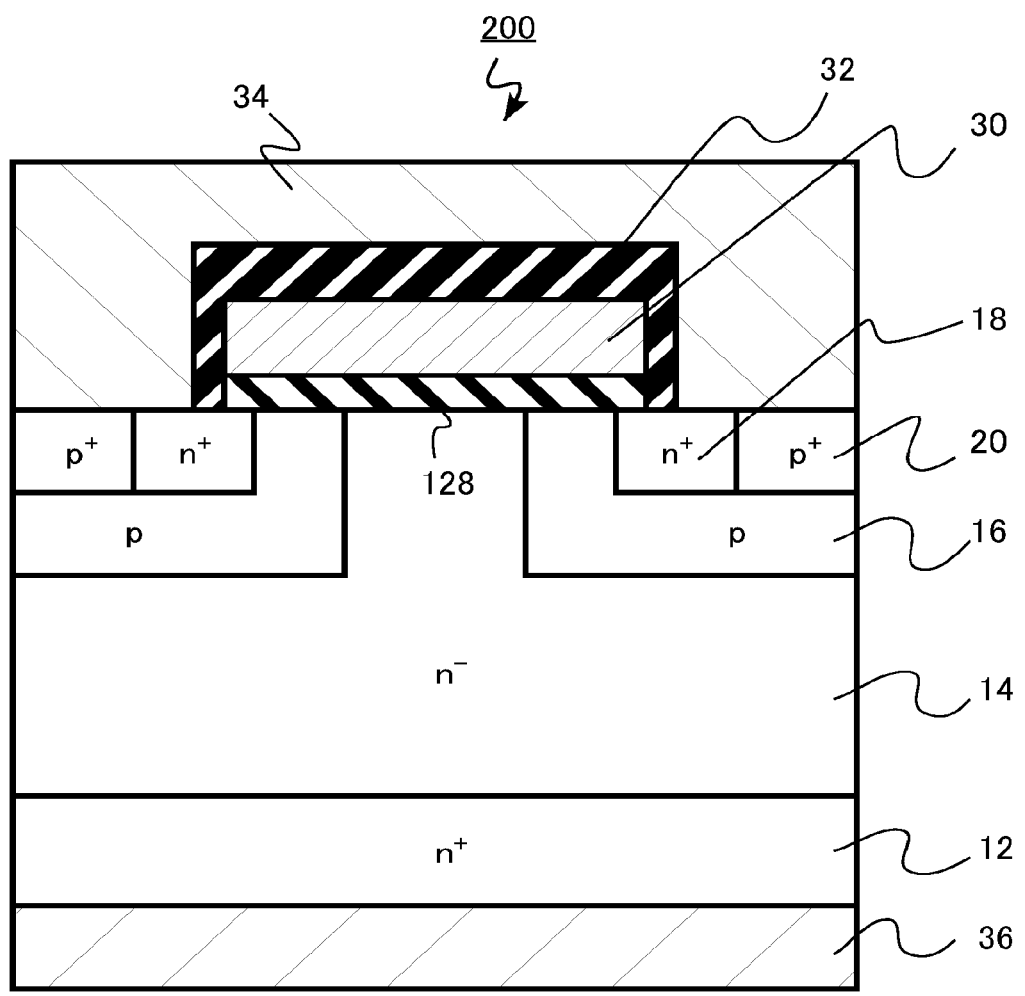
FIG. 9 is a schematic sectional view of a semiconductor device according to a fifth embodiment.

FIG. 9 is a schematic sectional view illustrating a configuration of a MISFET which is a semiconductor device according to the present embodiment. This MISFET 200 is a DIMOSFET in which a p-well region and a source region are formed by ion implantation. Further, the MISFET 200 is an n-channel type MOSFET in which an electron is a carrier.

The gate insulating layer 128 includes, in the layer, at least one element selected from the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu). The gate insulating layer 128 also includes C (carbon).

A maximum concentration of the above element in the gate insulating layer 128 is preferably $1 \times 10^{18}$ cm$^{-3}$ or more, more preferably $1 \times 10^{19}$ cm$^{-3}$ or more, and further preferably $1 \times 10^{20}$ cm$^{-3}$ or more. The maximum concentration of the above element is, for example, $5 \times 10^{20}$ cm$^{-3}$ or less.

A maximum concentration of C (carbon) in the gate insulating layer 128 is preferably $1 \times 10^{18}$ cm$^{-3}$ or more, more preferably $1 \times 10^{19}$ cm$^{-3}$ or more, and further preferably $1 \times 10^{20}$ cm$^{-3}$ or more. The maximum concentration of C (carbon) is, for example, $5 \times 10^{20}$ cm$^{-3}$ or less.

Next, a method for manufacturing a semiconductor device according to the present embodiment will be described with reference to FIG. 9. Especially, a method for manufacturing the gate insulating layer 128 will be described. An example will be described in which the above element is B (boron).

First, an amorphous silicon film including B (boron) is deposited on a SiC layer 16 by a CVD method. A silicon oxide film in which B is included at a high concentration is formed by thermally oxidizing the amorphous silicon film.

During thermal oxidation, C (carbon) is diffused in the silicon oxide film from a front face of the SiC layer 16. A composite is formed when C combines with B and O in the silicon oxide film, and a fixed negative charge is formed.

Then, for example, a polycrystal silicon gate electrode is formed.

Regarding other process steps, the MISFET 200 illustrated in FIG. 9 is formed by using a known manufacturing method.

As a result of a first principle calculation by an inventor of the present disclosure, an element selected from the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) is stabilized by forming a composite by combining with C (carbon) and 0 (oxygen) in an insulating film, especially in a silicon oxide film. It has been clarified that this composite is stabilized in the silicon oxide film by trapping an electron and forming a negative fixed charge.

A threshold value of an n-channel type MISFET is increased by the fixed negative charge formed by the above-described composite. Accordingly, a MISFET having a high threshold voltage can be realized.

The above element forms a composite by combining with C (carbon) at a ratio of 1:1. Therefore, a maximum concentration of the above element is preferably 80% or more and 120% or less of a maximum concentration of C (carbon).

Further, the above element forms a composite by combining with C (carbon). Therefore a concentration of the above element at a predetermined position in a gate insulating layer is preferably 80% or more and 120% or less of a C (carbon) concentration measured at the predetermined position in the gate insulating layer. For example, in the case of performing a SIMS measurement in a film thickness direction, a concentration of the above element is preferably 80% or more and 120% or less of a C (carbon) concentration at the same position (first position) in the measurement range.

According to the present embodiment, an n-channel type MISFET having a high threshold voltage can be realized.

Sixth Embodiment

An inverter circuit and a driving device according to a sixth embodiment are a driving device including the semiconductor device according to the first embodiment.

Figure 10:
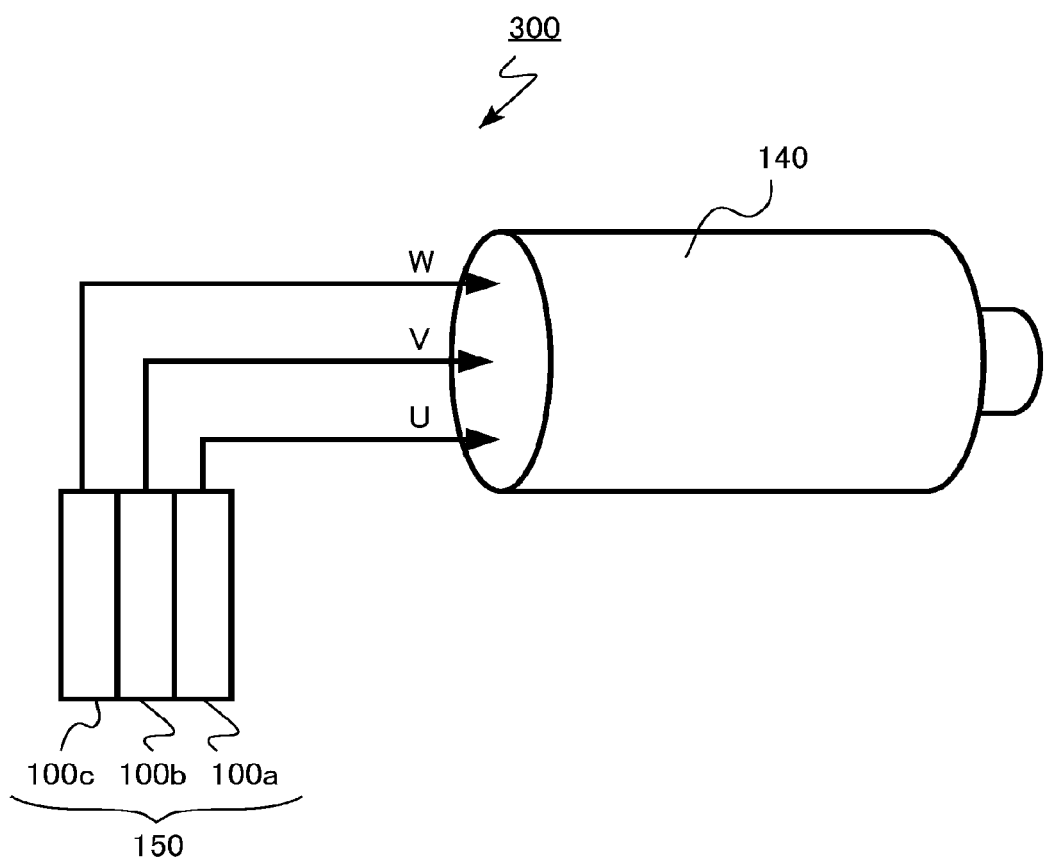
FIG. 10 is a schematic view of a driving device according to a sixth embodiment.

FIG. 10 is a schematic view of the driving device according to the present embodiment. A driving device 300 includes a motor 140 and an inverter circuit 150.

An inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, a three-phase inverter circuit 150 including three AC voltage output terminals U, V, and W can be realized. The motor 140 is driven by an AC voltage output from the inverter circuit 150.

According to the present embodiment, operation of the inverter circuit 150 and the driving device 300 are stabilized by including a MISFET having a high threshold voltage.

Seventh Embodiment

A vehicle according to a seventh embodiment is a vehicle including the semiconductor device according to the first embodiment.

Figure 11:
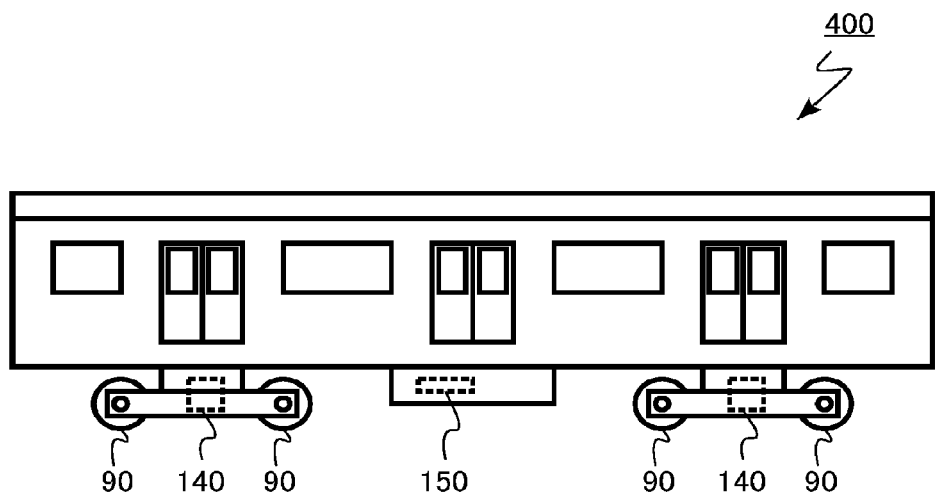
FIG. 11 is a schematic view of a vehicle according to a seventh embodiment.

FIG. 11 is a schematic view of the vehicle according to the present embodiment. A vehicle 400 according to the present embodiment is a railroad vehicle. The vehicle 400 includes a motor 140 and an inverter circuit 150. The inverter circuit 150 includes three semiconductor modules having the same configuration as the semiconductor module 100 according to the first embodiment. The three semiconductor modules are connected in parallel. Accordingly, a three-phase inverter circuit 150 including three AC voltage output terminals U, V, and W is realized. The motor 140 is driven by an AC voltage output from the inverter circuit 150. A wheel 90 of the vehicle 400 is rotated by the motor 140.

According to the present embodiment, operability of the vehicle 400 is stabilized by including a MISFET having a high threshold voltage.

Eighth Embodiment

A vehicle according to a seventh embodiment is a vehicle including the semiconductor device according to the first embodiment.

Figure 12:
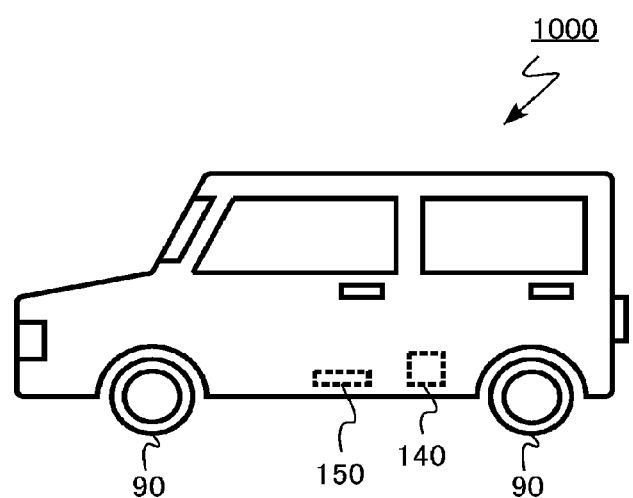
FIG. 12 is a schematic view of a vehicle according to an eighth embodiment.

FIG. 12 is a schematic view of the vehicle according to the present embodiment. A vehicle 1000 according to the present embodiment is an automobile. The vehicle 1000 includes a motor 140 and an inverter circuit 150.

An inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, a three-phase inverter circuit 150 including three AC voltage output terminals U, V, and W can be realized.

The motor 140 is driven by an AC voltage output from the inverter circuit 150. A wheel 90 of the vehicle 1000 is rotated by the motor 140.

According to the present embodiment, reliability of the vehicle 1000 is improved by including a MISFET having a high threshold voltage.

Ninth Embodiment

An elevator according to a ninth embodiment is an elevator including the semiconductor device according to the first embodiment.

Figure 13:
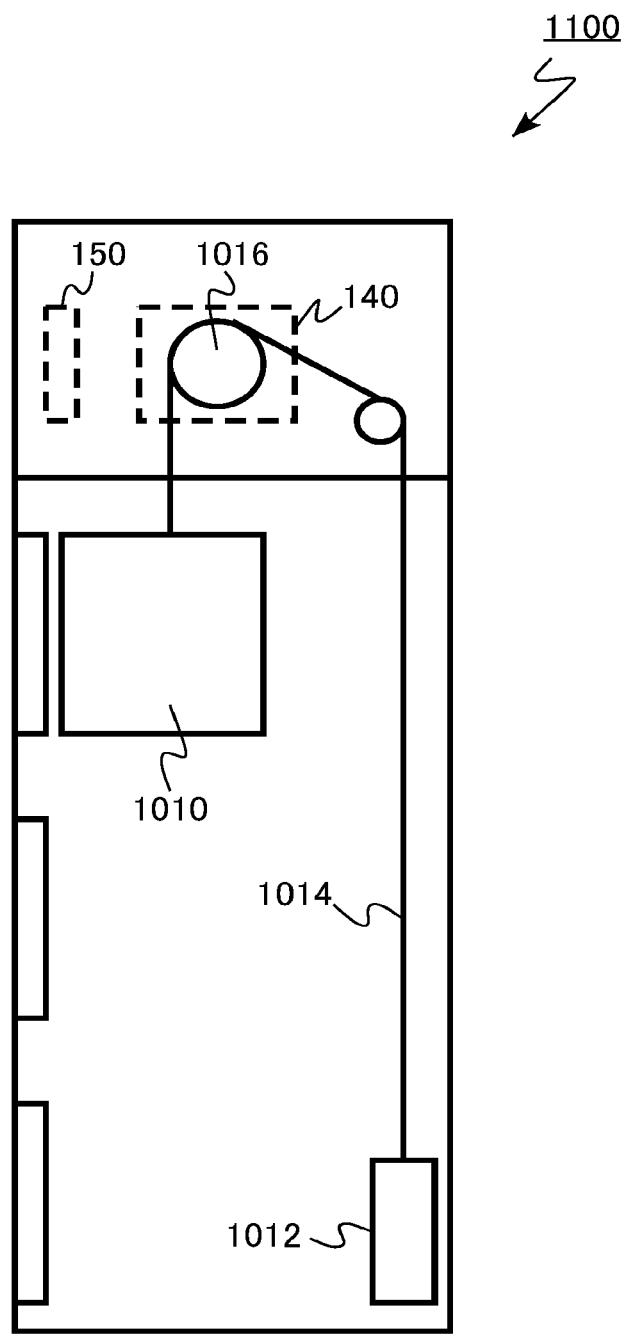
FIG. 13 is a schematic view of an elevator according to a ninth embodiment.

FIG. 13 is a schematic view of an elevator according to the present embodiment. An elevator 1100 according to the present embodiment includes an elevator car 1010, a counterweight 1012, a wire rope 1014, a hoisting machine 1016, a motor 140, and an inverter circuit 150.

An inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, a three-phase inverter circuit 150 including three AC voltage output terminals U, V, and W can be realized.

The motor 140 is driven by an AC voltage output from the inverter circuit 150. By the motor 140, the hoisting machine 1016 rotates, and the elevator car 1010 moves up and down.

According to the present embodiment, reliability of the elevator 1100 is improved by including a MISFET having a high threshold voltage.

In the first to fifth embodiments, an example in which a crystal structure of silicon carbide is 4H—SiC has been described above. However, the present disclosure can be applied to silicon carbide having other crystal structures such as 6H—SiC and 3C—SiC.

Further, in the first to fifth embodiments, the example has been described in which a MISFET is an n-channel type and a planer type. However, the present disclosure can be applied to an n-channel type and a trench type MISFET. Furthermore, the present disclosure can be applied to an n-channel type insulated gate bipolar transistor (IGBT).

Further, in the seventh to ninth embodiments, an example has been described in which the semiconductor device according to the present disclosure is applied to a vehicle and an elevator. However, the semiconductor device according to the present disclosure can be applied, for example, to a power conditioner of a solar power generation system.

Furthermore, the present disclosure can be applied to a semiconductor device including a gate insulating layer formed on a face inclined at 0° or more and 8° or less with respect to a silicon {111} face. In addition, the present disclosure can be applied to a semiconductor device including a gate insulating layer formed on a face inclined at 0° or more and 8° or less with respect to a diamond {111} face.

Although a conventional charge trapping film needs charge injection, an electrical charge can be injected in high density. However, the conventional charge trapping film has a problem that a threshold voltage is lowered since an electrical charge is discharged with a lapse of time. This means in which a trapping state is not very stable.

On the other hand, in the present disclosure, a stable negative fixed charge can be formed in agate insulating layer. The negative fixed charge is very stable. Therefore, the charge hardly goes in and out from the insulating film. One problem may be a trap amount cannot be increased much. However, the problem can be solved by increasing a density by forming a trap in an entire film by using a multilayer film or forming a thick film.

While certain embodiments have been described, these embodiments have been presented by way of example only, and are not intended to limit the scope of the inventions. Indeed, the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a p-type SiC layer having a first plane;
   a gate electrode; and
   a gate insulating layer provided between the first plane and the gate electrode, the gate insulating layer including;
   a first layer,
   a second layer having a higher oxygen density than the first layer, and
   a first region provided between the first layer and the second layer, the first region including a first element, the first element being at least one element in the group of N (nitrogen), P (phosphorus), As (arsenic), Sb (antimony), and Bi (bismuth).

2. The semiconductor device according to claim 1, wherein the first region has a first concentration peak of the first element.

3. The semiconductor device according to claim 2, wherein a full width at half maximum of the first concentration peak is equal to or less than 1 nm.

4. The semiconductor device according to claim 2, wherein concentration of the first concentration peak is $4 \times 10^{19}$ cm$^{-3}$ or more and $6.4 \times 10^{22}$ cm$^{-3}$ or less.

5. The semiconductor device according to claim 1, wherein the second layer is provided between the first layer and the gate electrode.

6. The semiconductor device according to claim 1, wherein the second layer contacts with the gate electrode.

7. The semiconductor device according to claim 1, wherein the first layer and the second layer are one of materials in the group of silicone oxide, aluminum oxide, hafnium oxide, zirconium oxide, hafnium aluminum oxide, zirconium aluminum oxide, hafnium silicate, and zirconium silicate.

8. The semiconductor device according to claim 1, further comprising a second region provided between the SiC layer and the gate insulating layer, the second region including a second element, the second element being at least one second element in the group of N (nitrogen), P (phosphorus), As (arsenic), Sb (antimony), and Bi (bismuth).

9. The semiconductor device according to claim 8, wherein the second region has a second concentration peak of the second element.

10. The semiconductor device according to claim 9, wherein a full width at half maximum of the second concentration peak is equal to or less than 1 nm.

11. The semiconductor device according to claim 9, wherein concentration of the second concentration peak is $4 \times 10^{19}$ cm$^{-3}$ or more and $6.4 \times 10^{22}$ cm$^{-3}$ or less.

12. The semiconductor device according to claim 8, wherein the first element and the second element are the same.

13. The semiconductor device according to claim 8, wherein the first plane is a plane inclined at 0° or more and 8° or less with respect to a (0001) face, and the second element is P (phosphorus) or As (arsenic).

14. The semiconductor device according to claim 8, wherein the first plane is a plane inclined at 0° or more and 8° or less with respect to a (000-1) face, or the first plane is a plane inclined at 0° or more and 8° or less with respect to a <0001> direction, and the second element is N (nitrogen).

15. A semiconductor device, comprising:
a p-type SiC layer;
a gate electrode; and
a gate insulating layer provided between the SiC layer and the gate electrode, the gate insulating layer including C (carbon) and at least one element in the group of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu).

16. The semiconductor device according to claim 15, wherein a maximum concentration of the at least one element in the gate insulating layer is equal to or greater than $1 \times 10^{18}$ cm$^{-3}$.

17. The semiconductor device according to claim 15, wherein a maximum concentration of C (carbon) in the gate insulating layer is equal to or greater than $1 \times 10^{18}$ cm$^{-1}$.

18. The semiconductor device according to claim 15, wherein a maximum concentration of the at least one element in the gate insulating layer is 80% more and the 120% or less of a maximum concentration of C (carbon) in the gate insulating layer.

19. The semiconductor device according to claim 15, wherein a concentration of the at least one element at a first position in the gate insulating layer is 80% more and 120% or less of a concentration of C (carbon) at the first position.

20. An inverter circuit comprising the semiconductor device according to claim 1.

* * * * *